(12) United States Patent
Wada et al.

(10) Patent No.: US 10,651,404 B2
(45) Date of Patent: May 12, 2020

(54) TRANSPARENT CONDUCTIVE FILM-EQUIPPED GLASS SUBSTRATE AND METHOD FOR MANUFACTURING SAME

(71) Applicant: NIPPON ELECTRIC GLASS CO., LTD., Otsu-shi, Shiga (JP)

(72) Inventors: Masanori Wada, Otsu (JP); Ken Kashiwadani, Otsu (JP); Toru Hirao, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 198 days.

(21) Appl. No.: 15/535,744

(22) PCT Filed: Jan. 8, 2016

(86) PCT No.: PCT/JP2016/050470
§ 371 (c)(1),
(2) Date: Jun. 14, 2017

(87) PCT Pub. No.: WO2016/143366
PCT Pub. Date: Sep. 15, 2016

(65) Prior Publication Data
US 2018/0351116 A1 Dec. 6, 2018

(30) Foreign Application Priority Data
Mar. 10, 2015 (JP) .................................. 2015-047169

(51) Int. Cl.
*H01L 51/00* (2006.01)
*B23K 26/351* (2014.01)
(Continued)

(52) U.S. Cl.
CPC ........ *H01L 51/0096* (2013.01); *B23K 26/351* (2015.10); *C03C 3/064* (2013.01);
(Continued)

(58) Field of Classification Search
CPC . H01L 51/0096; H01L 51/5262; H01L 51/52; H01L 51/5206; H01L 51/0023;
(Continued)

(56) References Cited

U.S. PATENT DOCUMENTS 5,702,565 A * 12/1997 Wu .................... H05B 33/10
117/44
5,702,656 A * 12/1997 Sarver .................. B29C 31/041
264/102
(Continued)

FOREIGN PATENT DOCUMENTS

CN 1855481 A 11/2006
EP 1 119 057 A2 7/2001
(Continued)

OTHER PUBLICATIONS

Official Communication issued in International Patent Application No. PCT/JP2016/050470, dated Mar. 22, 2016.
(Continued)

*Primary Examiner* — Michael Zhang
(74) *Attorney, Agent, or Firm* — Keating and Bennett, LLP

(57) ABSTRACT

Provided is a transparent conductive film-equipped glass substrate that, during patterning by laser of a transparent conductive film formed on an underlying glass layer, can prevent the transparent conductive film or the underlying glass layer from being discolored or damaged, and a manufacturing method thereof. A transparent conductive film-equipped glass substrate 6 includes a glass substrate, an underlying glass layer provided on the glass substrate, and a transparent conductive film 3 provided on the underlying glass layer and subjected to patterning by laser. The underlying glass layer has an absorptance of a wavelength of the laser lower than the transparent conductive film 3 and higher than the glass substrate. A patterned region 10 formed by
(Continued)

removing part of the transparent conductive film 3 by the patterning by laser includes a first linear portion 11, a second linear portion 12, and a connecting portion 13 connecting between the first linear portion 11 and the second linear portion 12. The first linear portion 11 and the second linear portion 12 form an angle of 120° or less with each other. The connecting portion 13 has a radius of curvature of 0.5 mm or more.

8 Claims, 3 Drawing Sheets

(51) Int. Cl.
  *C03C 3/064* (2006.01)
  *C03C 17/34* (2006.01)
  *H01L 51/52* (2006.01)
  *H05B 33/02* (2006.01)
  *H05B 33/26* (2006.01)

(52) U.S. Cl.
  CPC .......... *C03C 17/3417* (2013.01); *H01L 51/52* (2013.01); *H01L 51/5262* (2013.01); *H05B 33/02* (2013.01); *H05B 33/26* (2013.01); *B32B 2307/202* (2013.01); *B32B 2307/412* (2013.01); *C03C 2217/77* (2013.01); *C03C 2217/94* (2013.01); *C03C 2218/328* (2013.01); *H01L 51/0023* (2013.01); *H01L 51/5206* (2013.01)

(58) Field of Classification Search
  CPC .... H05B 33/26; H05B 33/02; C03C 17/3417; C03C 3/064; C03C 2218/328; C03C 2217/94; C03C 2217/77; B23K 26/351; B32B 2307/412; B32B 2307/202
  See application file for complete search history.

(56) References Cited

U.S. PATENT DOCUMENTS

| | | | | |
|---|---|---|---|---|
| 2001/0053560 A1* | 12/2001 | Shinohara | ....... | H01L 31/022408 438/98 |
| 2006/0238326 A1 | 10/2006 | Repetto et al. | | |
| 2009/0221141 A1* | 9/2009 | Cheng | ....... | H01J 9/02 438/609 |
| 2011/0001159 A1* | 1/2011 | Nakamura | ............. | B82Y 20/00 257/98 |
| 2012/0194441 A1* | 8/2012 | Frey | ........... | G06F 3/041 345/173 |
| 2014/0103314 A1* | 4/2014 | Satoh | .................. | H01L 51/5271 257/40 |
| 2014/0347319 A1 | 11/2014 | Lin et al. | | |
| 2015/0299477 A1 | 10/2015 | Yoshii | | |
| 2016/0060162 A1* | 3/2016 | Mashimo | ............ | H01L 51/0096 257/40 |
| 2016/0203888 A1* | 7/2016 | Chen | ................... | H01L 31/1888 428/156 |

FOREIGN PATENT DOCUMENTS

| | | |
|---|---|---|
| EP | 2 712 851 A1 | 4/2014 |
| JP | 2001-266654 A | 9/2001 |
| JP | 2006-267834 A | 10/2006 |
| JP | 2007-207554 A | 8/2007 |
| JP | 2010-198797 A | 9/2010 |
| JP | 2012-170955 A | 9/2012 |
| JP | 2014-170736 A | 9/2014 |
| TW | 201423768 A | 6/2014 |
| WO | 2011/108494 A1 | 9/2011 |
| WO | 2014/010621 A1 | 1/2014 |
| WO | 2014/181641 A1 | 11/2014 |
| WO | WO-2014181641 A1 * | 11/2014 ......... H01L 51/5268 |

OTHER PUBLICATIONS

Official Communication issued in European Patent Application No. 16761338.9, dated Oct. 16, 2018.
Official Communication issued in European Patent Application No. 16761338.9, dated Jul. 2, 2019.
Official Communication issued in corresponding Chinese Patent Application No. 201680014557.8, dated Aug. 2, 2019.
Shuai, "Improving the laser cutting precision analysis of medium and heavy plates", Applied Technology, Issue 244, May 31, 2014, pp. 67-68.
Zong, "Welding Structure Manufacturing Technical Manual", Shanghai Science and Technology Press, Jan. 31, 2012, 4 pages.

* cited by examiner

[FIG. 1]
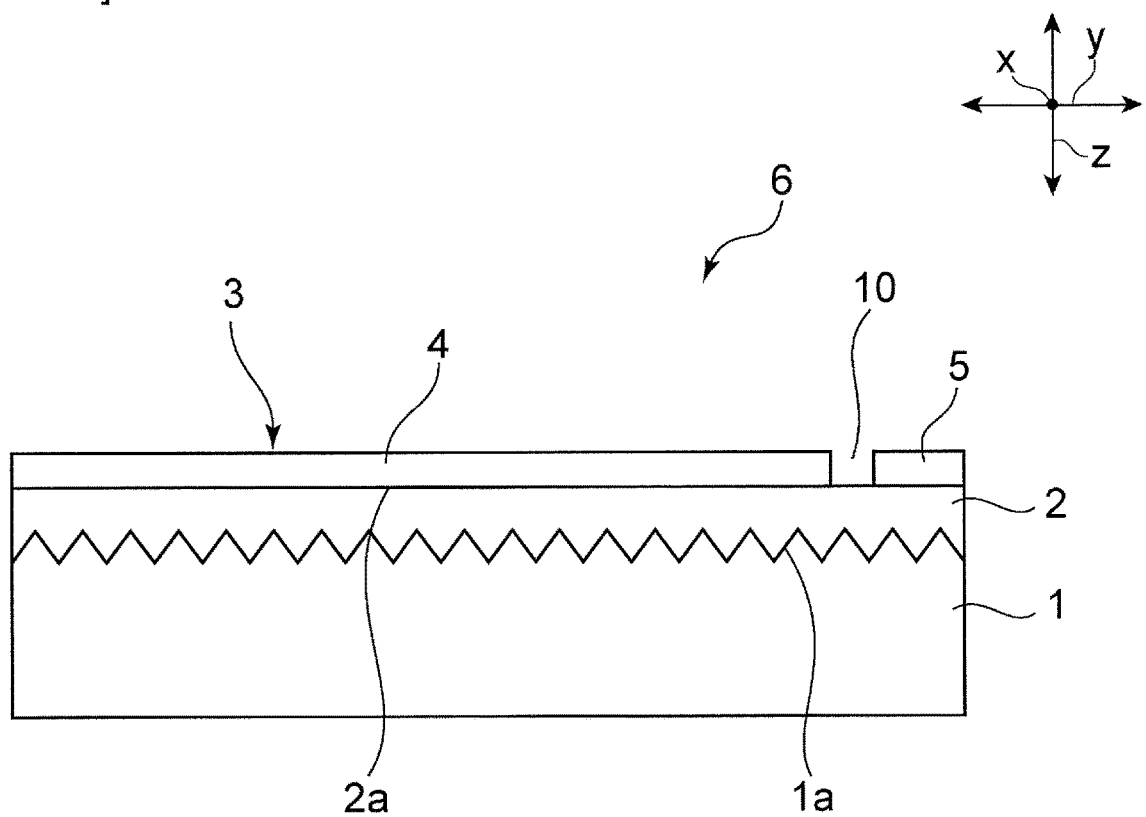

[FIG. 2]
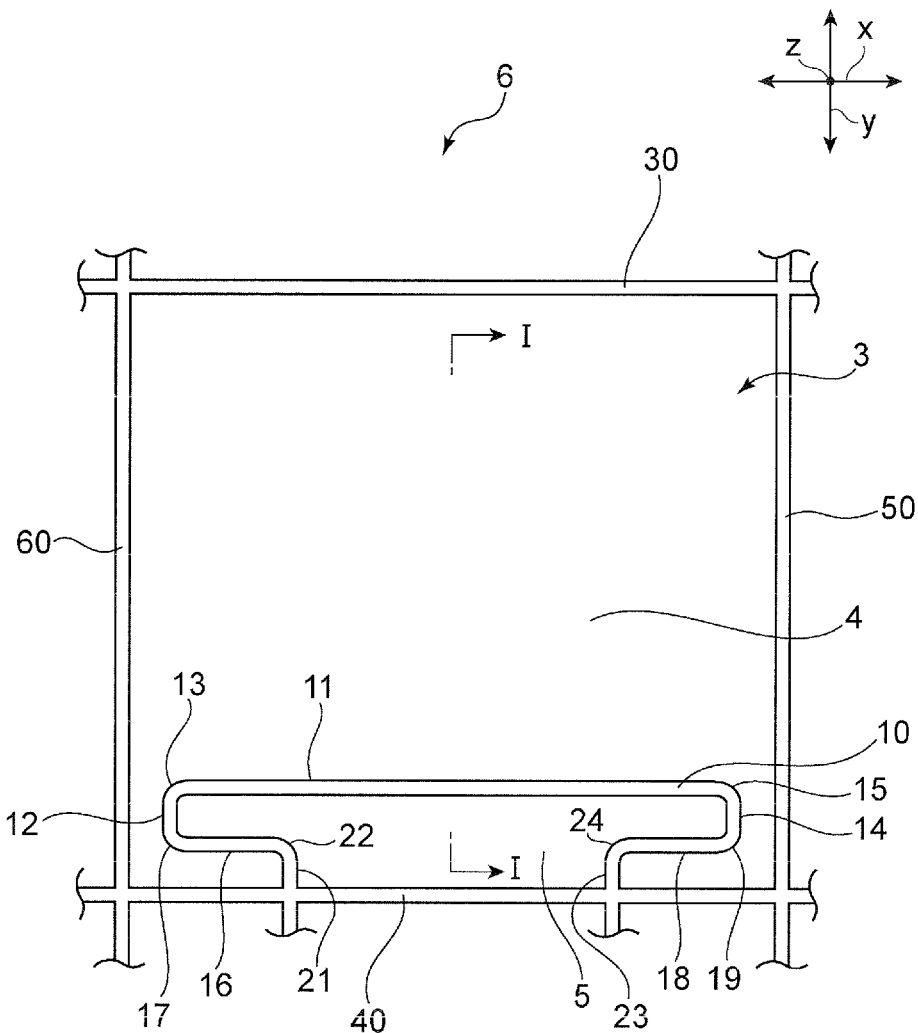
[FIG. 3]
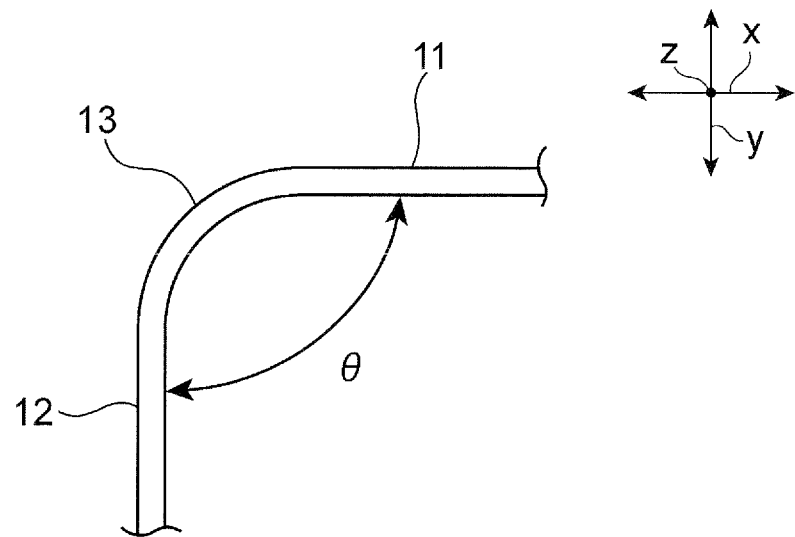

[FIG. 4]
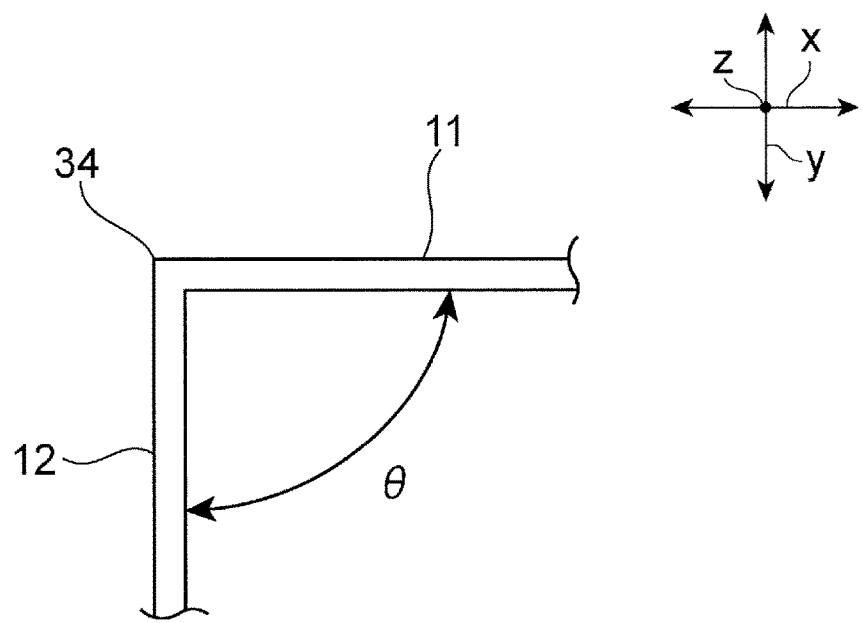

US 10,651,404 B2

TRANSPARENT CONDUCTIVE FILM-EQUIPPED GLASS SUBSTRATE AND METHOD FOR MANUFACTURING SAME

TECHNICAL FIELD

The present invention relates to transparent conductive film-equipped glass substrates and methods for manufacturing the same.

BACKGROUND ART

In relation to plasma displays, electroluminescent devices, and the like, it is known that a transparent conductive film for use as an electrode is formed on a transparent substrate, such as a glass substrate, and the transparent conductive film is subjected to patterning by laser (Patent Literatures 1 and 2).

In the case of organic electroluminescent devices or the like, in order to increase the light extraction efficiency, an underlying glass layer having a higher refractive index than the glass substrate may be provided between the glass substrate and the transparent conductive film.

CITATION LIST

Patent Literature

[PTL 1]
JP-A-2007-207554
[PTL 2]
JP-A-2006-267834

SUMMARY OF INVENTION

Technical Problem

The inventors have found a problem that when the underlying glass layer is provided, the transparent conductive film or the underlying glass layer is likely to be discolored or damaged during patterning of the transparent conductive film by laser.

An object of the present invention is to provide a transparent conductive film-equipped glass substrate that, during patterning by laser of a transparent conductive film formed on an underlying glass layer, can prevent the transparent conductive film or the underlying glass layer from being discolored or damaged, and a manufacturing method thereof.

Solution to Problem

A transparent conductive film-equipped glass substrate according to the present invention is a transparent conductive film-equipped glass substrate including a glass substrate, an underlying glass layer provided on the glass substrate, and a transparent conductive film provided on the underlying glass layer and subjected to patterning by laser, the underlying glass layer has an absorptance of a wavelength of the laser lower than the transparent conductive film and higher than the glass substrate, a patterned region formed by removing part of the transparent conductive film by the patterning by laser includes a first linear portion, a second linear portion, and a connecting portion connecting between the first linear portion and the second linear portion, the first linear portion and the second linear portion form an angle of 120° or less with each other, and the connecting portion has a radius of curvature of 0.5 mm or more.

Examples of the underlying glass layer include those containing bismuth-based glass.

Examples of the underlying glass layer include those having a higher refractive index than the glass substrate.

An example of the laser that can be used is femtosecond laser.

Asperities are preferably formed on a surface of the glass substrate on which the underlying glass layer is provided.

The transparent conductive film-equipped glass substrate according to the present invention is used, for example, as a glass substrate for an organic electroluminescent device.

A manufacturing method according to the present invention is a method that enables the manufacture of the above transparent conductive film-equipped glass substrate according to the present invention, the method including the steps of: producing the glass substrate on which the transparent conductive film before being subjected to the patterning is formed on the underlying glass layer; and applying the laser to the transparent conductive film to scan the first linear portion, the connecting portion, and the second linear portion in this order or reverse order with the laser, thus forming the patterned region.

Advantageous Effects of Invention

According to the present invention, during patterning by laser of a transparent conductive film formed on an underlying glass layer, the transparent conductive film and the underlying glass layer can be prevented from being discolored or damaged.

BRIEF DESCRIPTION OF DRAWINGS

FIG. 1 is a schematic cross-sectional view showing a transparent conductive film-equipped glass substrate according to one embodiment of the present invention.

FIG. 2 is a schematic plan view showing the transparent conductive film-equipped glass substrate according to the one embodiment of the present invention.

FIG. 3 is a schematic plan view showing on an enlarge scale a first linear portion, a second linear portion, and a connecting portion shown in FIG. 2.

FIG. 4 is a schematic plan view showing on an enlarge scale a first linear portion, a second linear portion, and a connecting portion in a comparative example.

DESCRIPTION OF EMBODIMENTS

Hereinafter, a description will be given of a preferred embodiment. However, the following embodiment is merely illustrative and the present invention is not limited to the following embodiment. Throughout the drawings, members having substantially the same functions may be referred to by the same reference characters.

FIG. 1 is a schematic cross-sectional view showing a transparent conductive film-equipped glass substrate according to one embodiment of the present invention. FIG. 2 is a schematic plan view showing the transparent conductive film-equipped glass substrate according to the one embodiment of the present invention. FIG. 1 is a schematic cross-sectional view taken along the line I-I shown in FIG. 2. As shown in FIG. 1, a transparent conductive film-equipped glass substrate 6 according to this embodiment includes a glass substrate 1, an underlying glass layer 2 provided on a principal surface 1a of the glass substrate 1, and a transparent conductive film 3 provided on a principal surface 2a of the underlying glass layer 2. Asperities are formed on the principal surface 1a of the glass substrate 1. Therefore, the underlying glass layer 2 is provided on the principal surface 1a having asperities formed thereon.

Formed in the transparent conductive film 3 is a patterned region 10 formed by removing part of the transparent conductive film 3 by patterning using laser. The transparent conductive film 3 is divided by the patterned region 10 into a first electrode 4 and a second electrode 5.

The transparent conductive film-equipped glass substrate 6 according to this embodiment can be used, for example, as a glass substrate for an organic electroluminescent device. When it is used as a glass substrate for an organic electroluminescent device, an organic electroluminescent layer is provided on the top of the transparent conductive film-equipped glass substrate 6. Light emitted from the organic electroluminescent layer due to the production of luminescence in the organic electroluminescent layer passes through the transparent conductive film 3 and the glass substrate 1 and is then extracted to the outside. The underlying glass layer 2 is provided between the transparent conductive film 3 and the glass substrate 1 in order to increase the extraction efficiency of light emitted from the organic electroluminescent layer.

To be specific, generally, the organic electroluminescent layer has a refractive index nd of about 1.8 to 1.9, the transparent conductive film 3 has a refractive index nd of about 1.9 to 2.0, and the glass substrate 1 normally has a refractive index nd of about 1.5. Therefore, if the underlying glass layer 2 is not provided, the difference in refractive index between the glass substrate 1 and the transparent conductive film 3 is large, so that light from the organic electroluminescent layer is reflected at the interface between the glass substrate and the transparent conductive film 3 and thus cannot efficiently be extracted to the outside.

When, as in this embodiment, the underlying glass layer 2 is provided between the glass substrate 1 and the transparent conductive film 3 to bring the refractive index nd of the underlying glass layer 2 close to the refractive index nd of the transparent conductive film 3, the above-mentioned light reflection can be reduced, so that the light can be efficiently extracted to the outside. Therefore, the underlying glass layer 2 is generally made of a glass having a higher refractive index nd than the glass substrate 1, for example, having a refractive index of 1.8 to 2.2. Examples of such a glass include bismuth-based glasses. The bismuth-based glasses include glasses containing 10% by mole or more $Bi_2O_3$ in a glass composition.

Specific examples of compositions of the bismuth-based glasses include a glass containing, in % by mole, 10 to 35% $Bi_2O_3$, 20 to 35% $B_2O_3$, over 5 to 35% $SiO_2$, 0 to 10% $Al_2O_3$, 0 to 10% ZnO, and 1 to 8% $ZrO_2$, and a glass containing, in % by mole, 10 to 35% $Bi_2O_3$, 20 to 35% $B_2O_3$, 21 to 45% $SiO_2+Al_2O_3$, 0 to 10% ZnO, and 0.1 to 10% $ZrO_2$. Herein, "$SiO_2+Al_2O_3$" means the sum of the contents of $SiO_2$ and $Al_2O_3$.

Furthermore, when, as in this embodiment, asperities are formed on the principal surface 1a of the glass substrate 1, light reflection at the interface between the underlying glass layer 2 and the glass substrate 1 can be reduced, so that the light can be more efficiently extracted to the outside. The glass substrate 1 having asperities formed on the principal surface 1a thereof can be produced, for example, by subjecting a glass plate having a flat surface to processing, such as sandblasting, sol-gel spraying or etching. Alternatively, the above glass substrate can be produced by subjecting a glass plate to press forming using a die having asperities formed on the surface or by roll-forming molten glass using a roll having asperities formed on the surface.

The surface roughness Ra of the principal surface 1a is, for example, preferably within a range of 0.05 to 2 μm and more preferably within a range of 0.05 to 1.5 μm. If the surface roughness Ra of the principal surface 1a is too small, a sufficient light extraction efficiently may not be able to be achieved. On the other hand, if the surface roughness Ra of the principal surface 1a is too large, a sufficient light extraction efficiently may not be able to be achieved and the thickness of the underlying glass layer 2 may have to be increased than necessary.

Examples of the transparent conductive film 3 that can be used include thin films of composite oxides having electrical conductivity, such as indium tin oxides (ITO), aluminum zinc oxides (AZO), indium zinc oxides (IZO), and fluorine-doped tin oxides (FTO). Indium tin oxides are particularly preferably used.

No particular limitation is placed on the type of the glass substrate 1 so long as it does not reduce the light extraction efficiency.

In the present invention, the transparent conductive film 3 is patterned by laser to remove part of the transparent conductive film 3, thus forming the patterned region 10. The laser that is used is a laser as to the wavelength of which the transparent conductive film 3 has a high absorptance. For example, an ITO film exhibits high absorptance of wavelengths of 1000 nm or more. Therefore, the ITO film can be patterned using laser having a wavelength of 1000 nm or more to partly remove the ITO film by laser irradiation, thus forming a patterned region 10.

As described previously, the inventors have found that, during patterning by laser of the transparent conductive film 3 to remove part of the transparent conductive film 3 by laser irradiation, the transparent conductive film 3 or the underlying glass layer 2 may be discolored or damaged. They have found that such discoloration or damage is likely to occur particularly at corners at which the scanning direction of the laser changes to a perpendicular direction. They also have found from studies on the reason for this that when the laser scanning direction changes to a perpendicular direction, the scanning speed decreases, the laser irradiation time thus becomes relatively long, so that heat is accumulated at the portions to discolor or damage the portions. Furthermore, they have found that because the underlying glass layer 2 also has a high absorptance of the wavelength of the laser, the above phenomenon occurs.

Therefore, in the present invention, the underlying glass layer 2 has an absorptance of the wavelength of the laser lower than that of the transparent conductive film 3 and higher than that of the glass substrate 1. The absorptance of the underlying glass layer 2 as to the wavelength of the laser is preferably within a range of 10 to 60% of that of the transparent conductive film 3 and more preferably within a range of 10 to 30% thereof.

No particular limitation is placed on the wavelength of the laser so long as the transparent conductive film 3 has a high absorptance of the wavelength. The wavelength of the laser is, for example, preferably 1000 nm or more, more preferably 1300 nm or more, and still more preferably 1500 nm or more. No particular limitation is placed on the upper limit of the wavelength of the laser, but the wavelength of the laser is generally not more than 2000 nm.

The laser is preferably sub-10-picosecond pulse laser, more preferably subpicosecond, ultrashort pulse laser, and particularly preferably laser laser. By the use of laser having such a short pulse width, a multiphoton absorption phenomenon is generated, so that patterning can be achieved without diffusing heat to the surrounding portions.

The spot diameter of the laser is preferably within a range of 20% to 100% of the width of the patterned region and more preferably within a range of 50% to 100% thereof.

The laser is generally applied in the direction of thickness of the transparent conductive film 3 (z direction) from the transparent conductive film 3 side.

FIG. 2 is a schematic plan view showing the transparent conductive film-equipped glass substrate according to the one embodiment of the present invention. The transparent conductive film-equipped glass substrate 6 shown in FIG. 2 represents a patterned circuit of the transparent conductive film 3 corresponding to one organic electroluminescent device. The transparent conductive film-equipped glass substrate 6 shown in FIG. 2 is a piece of glass substrate of a mother glass substrate, in which other organic electroluminescent devices are formed next to the piece of glass substrate.

As shown in FIG. 2, linear patterned regions 30 and 40 are formed to extend in the x direction and linear patterned regions 50 and 60 are formed to extend in the y direction orthogonal to the linear patterned regions 30 and 40. The transparent conductive film 3 is separated from transparent conductive films of adjacent devices by the above patterned regions 30, 40, 50, and 60.

The patterned region 10 shown in FIG. 1 is formed in the transparent conductive film 3. The transparent conductive film 3 is divided by the patterned region 10 to form a first electrode 4 and a second electrode 5. For example, the first electrode 4 and the second electrode 5 can be used as an anode and a cathode, respectively. The second electrode can be connected to an electron-injection electrode provided on the top of the organic electroluminescent layer.

As shown in FIG. 2, the patterned region 10 includes a first linear portion 11 extending in the x direction and a second linear portion 12 extending in the y direction. The first linear portion 11 and the second linear portion 12 are connected by a connecting portion 13. The patterned region 10 further includes a second linear portion 14 extending in the y direction and the second linear portion 14 and the first linear portion 11 are connected by a connecting portion 15.

Furthermore, the patterned region 10 also includes a first linear portion 16 extending in the x direction and the first linear portion 16 and the second linear portion 12 are connected by a connecting portion 17. Moreover, the patterned region 10 also includes a first linear portion 18 extending in the x direction and the first linear portion 18 and the second linear portion 14 are connected by a connecting portion 19.

The patterned region 10 further includes a second linear portion 21 extending in the y direction and the second linear portion 21 and the first linear portion 16 are connected by a connecting portion 22. Furthermore, the patterned region 10 also includes a second linear portion 23 extending in the y direction and the second linear portion 23 and the first linear portion 18 are connected by a connecting portion 24.

FIG. 3 is a schematic plan view showing on an enlarge scale the first linear portion 11, the second linear portion 12, and the connecting portion 13 shown in FIG. 2. As shown in FIG. 3, the first linear portion 11 and the second linear portion 12 are formed so that the angle formed between them is θ. In this embodiment, the angle θ is 90°. The angle θ formed by the first linear portion 11 and the second linear portion 12 in the present invention is not limited to the above and only has to be not more than 120°. The angle θ formed by the first linear portion 11 and the second linear portion 12 is preferably within a range of 80° to 100°.

The connecting portion 13 connecting between the first linear portion 11 and the second linear portion 12 is formed into an arc in this embodiment. In the present invention, the radius of curvature of the connecting portion 13 is 0.5 mm or more. The radius of curvature of the connecting portion 13 is preferably 1.0 mm or more. Since the radius of curvature of the connecting portion 13 is within the above range, the transparent conductive film 3 and the underlying glass layer 2 can be more effectively prevented from being discolored or damaged. If the radius of curvature of the connecting portion 13 is too large, the patterned region may be difficult to form. Therefore, the radius of curvature of the connecting portion 13 is preferably not more than 5.0 mm and more preferably not more than 3.0 mm.

FIG. 4 is a schematic plan view showing on an enlarge scale a first linear portion 11, a second linear portion 12, and a connecting portion 34 in a comparative example. In the comparative example shown in FIG. 4, the connecting portion 34 connecting between the first linear portion 11 and the second linear portion 12 is not formed into an arc having a radius of curvature of 0.5 mm or more. When in this case the first linear portion 11, the connecting portion 34, and the second linear portion 12 are scanned in this order by laser or the second linear portion 12, the connecting portion 34, and the first linear portion 11 are scanned in this order by laser, there arises a moment when the laser does not move at the connecting portion 34 in either the x direction or the y direction. Therefore, a site appears where the laser stays for a long time. Heat is accumulated in the site, so that the transparent conductive film 3 or the underlying glass layer 2 is discolored or damaged.

In contrast, when as shown in FIG. 3 the connecting portion 13 is formed into an arc having a radius of curvature of 0.5 mm or more, laser passes along the connecting portion 13 while always moving in at least either the x direction or the y direction and no site appears where the laser stays for a long time. Therefore, the transparent conductive film 3 and the underlying glass layer 2 can be prevented from being discolored or damaged.

Although the description of the connecting portion 13 has been given with reference to FIGS. 3 and 4, the connecting portions 15, 17, 19, 22, and 24 shown in FIG. 2, each formed into an arc having a radius of curvature of 0.5 mm or more, like the connecting portion 13, can prevent the transparent conductive film 3 or the underlying glass layer 2 from being discolored or damaged at these portions.

Although the description with reference to FIG. 2 has been given by defining the linear portions extending in the x direction as first linear portions and defining the linear portions extending in the y direction as second linear portions, the present invention is not limited to this definition. The linear portions extending in the y direction may be defined as first linear portions and the linear portions extending in the x direction may be defined as second linear portions.

REFERENCE SIGNS LIST

1 . . . glass substrate
1a . . . principal surface
2 . . . underlying glass layer
2a . . . principal surface
3 . . . transparent conductive film
4 . . . first electrode
5 . . . second electrode 6 . . . transparent conductive film-equipped glass substrate
10, 30, 40, 50, 60 . . . patterned region
11, 16, 18 . . . first linear portion
12, 14, 21, 23 . . . second linear portion
13, 15, 17, 19, 22, 24, 34 . . . connecting portion

The invention claimed is:

1. A transparent conductive film-equipped glass substrate including a glass substrate, an underlying glass layer provided on the glass substrate, and a transparent conductive film provided on the underlying glass layer and subjected to patterning by laser,
the underlying glass layer having an absorptance of a wavelength of the laser lower than the transparent conductive film and higher than the glass substrate, wherein
a patterned region formed by removing part of the transparent conductive film by the patterning by laser includes a first linear portion, a second linear portion, and a connecting portion connecting between the first linear portion and the second linear portion, the first linear portion and the second linear portion form an angle of 120° or less with each other, and the connecting portion has a radius of curvature of 0.5 mm or more, and
a refractive index of the underlying glass layer is higher than a refractive index of the glass substrate such that the refractive index of the underlying glass layer is closer to a refractive index of the transparent conductive film than is the refractive index of the glass substrate so that light reflected at an interface between the underlying glass layer and the transparent conductive film is reduced.

2. The transparent conductive film-equipped glass substrate according to claim 1, wherein the underlying glass layer contains bismuth-based glass.

3. The transparent conductive film-equipped glass substrate according to claim 1, wherein the laser is femtosecond laser.

4. The transparent conductive film-equipped glass substrate according to claim 1, wherein asperities are formed on a surface of the glass substrate on which the underlying glass layer is provided.

5. The transparent conductive film-equipped glass substrate according to claim 1, being a glass substrate for an organic electroluminescent device.

6. The transparent conductive film-equipped glass substrate according to claim 1, wherein the angle formed by the first linear portion and the second linear portion is within a range of 80° to 120°.

7. The transparent conductive film-equipped glass substrate according to claim 1, wherein the radius of curvature of the connecting portion is within a range of 0.5 mm to 5.0 mm.

8. A method for manufacturing the transparent conductive film-equipped glass substrate according to claim 1, the method comprising the steps of:
producing the glass substrate on which the transparent conductive film before being subjected to the patterning is formed on the underlying glass layer; and
applying the laser to the transparent conductive film to scan the first linear portion, the connecting portion, and the second linear portion in this order or reverse order with the laser, thus forming the patterned region.

* * * * *